(12) United States Patent
Roberg et al.

(10) Patent No.: US 11,451,226 B2
(45) Date of Patent: Sep. 20, 2022

(54) RADIO FREQUENCY SWITCH CIRCUITRY

(71) Applicant: Qorvo US, Inc., Greensboro, NC (US)

(72) Inventors: Michael Roberg, Evergreen, CO (US); Charles Forrest Campbell, Dallas, TX (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 17/020,993

(22) Filed: Sep. 15, 2020

(65) Prior Publication Data

US 2022/0085806 A1 Mar. 17, 2022

(51) Int. Cl.
*H03K 17/687* (2006.01)

(52) U.S. Cl.
CPC ................. *H03K 17/6871* (2013.01)

(58) Field of Classification Search
CPC .................................................. H03K 17/6871
See application file for complete search history.

(56) References Cited

U.S. PATENT DOCUMENTS

| | | | | |
|---|---|---|---|---|
| 6,008,713 | A * | 12/1999 | Nasserbakht | H01F 17/0006 257/E21.022 |
| 10,236,852 | B2 * | 3/2019 | Schultz | H03H 7/1766 |
| 10,483,966 | B2 * | 11/2019 | Uehara | H03K 17/127 |
| 10,903,834 | B1 * | 1/2021 | Lemberg | H05K 1/0263 |
| 2021/0126593 | A1 * | 4/2021 | Roberts | H03F 1/565 |

OTHER PUBLICATIONS

Campbell, C. F., et al. "Wideband high power GaN on SiC SPDT switch MMICs," 2010 IEEE MTT-S International Microwave Symposium, Anaheim, Calif., 2010, pp. 145-148.

Ma, B. Y., et al. "High power AlGaN/GaN Ku-band MMIC SPDT switch and design consideration," 2008 IEEE MTT-S International Microwave Symposium Digest, Atlanta, Ga., 2008, pp. 1473-1476.

Zheng, X., et al. "Ka-Band High Power GaN SPDT Switch MMIC," 2013 IEEE Compound Semiconductor Integrated Circuit Symposium (CSICS), Monterey, Calif., 2013, pp. 1-5.

* cited by examiner

*Primary Examiner* — Metasebia T Retebo
(74) *Attorney, Agent, or Firm* — Withrow & Terranova, P.L.L.C.

(57) ABSTRACT

Radio frequency (RF) switch circuitry is disclosed having a field-effect transistor with a drain, a source, and a gate, wherein the gate is driven by switch driver circuitry having a control terminal for receiving switch-on and switch-off signals and a driver terminal for outputting on-state and off-state voltages. The switch driver circuitry is configured to respond to the switch-on signal by generating the on-state voltage that when applied to the gate allows an RF signal to pass between the drain and the source and respond to the switch-off signal by generating the off-state voltage that when applied to the gate blocks the RF signal from passing between the drain and the source. A low-pass filter has an inductor coupled between the gate and the driver terminal, wherein a direct current (DC) path between the gate and the driver terminal has a total DC resistance of no more than 100 $\Omega$.

25 Claims, 15 Drawing Sheets

RADIO FREQUENCY SWITCH CIRCUITRY

FIELD OF THE DISCLOSURE

The present disclosure relates to terminating networks for radio frequency switching circuitry and in particular to terminating networks that provide radio frequency switching circuitry with increased robustness and faster switching times.

BACKGROUND

Monolithic solid-state switches are key components of many microwave systems. Solid-state switches using field-effect transistors (FETs) are controlled by applying a gate-to-source voltage corresponding to desired state such as conducting on-state and a non-conducting off-state of the FET. Standard practice to date has been to apply gate-to-source voltage through a gate resistor where the resistance is much larger than the impedance of the gate-to-source capacitance of the FET at the switch operating frequency. As operating frequency increases, the impedance of a thin-film resistor in a monolithic process is limited. Furthermore, the current flowing in the gate resistor in the form of a thin-film resistor can present reliability and robustness issues that cannot be overcome with industry standard design techniques. Thus, there remains a need for increasing switch reliability and robustness to counter problems created by gate resistors. In addition, there remains an opportunity to substantially increase switching speed relative to present gate terminations.

SUMMARY

Disclosed is radio frequency (RF) switch circuitry that includes a field-effect transistor having a drain, a source, and a gate, wherein the gate is driven by switch driver circuitry having a control terminal for receiving a switch-on signal and a switch-off signal and a driver terminal for outputting an on-state voltage and an off-state voltage. The switch driver circuitry is configured to respond to the switch-on signal by generating the on-state voltage that when applied to the gate allows an RF signal to pass between the drain and the source and to respond to the switch-off signal by generating the off-state voltage that when applied to the gate blocks the RF signal from passing between the drain and the source. The RF switch circuitry further includes a low-pass filter that has an inductor coupled between the gate and the drive terminal, wherein a direct current path between the gate and the drive terminal has a direct current resistance of no more than 100Ω.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

DETAILED DESCRIPTION

Figure 1:
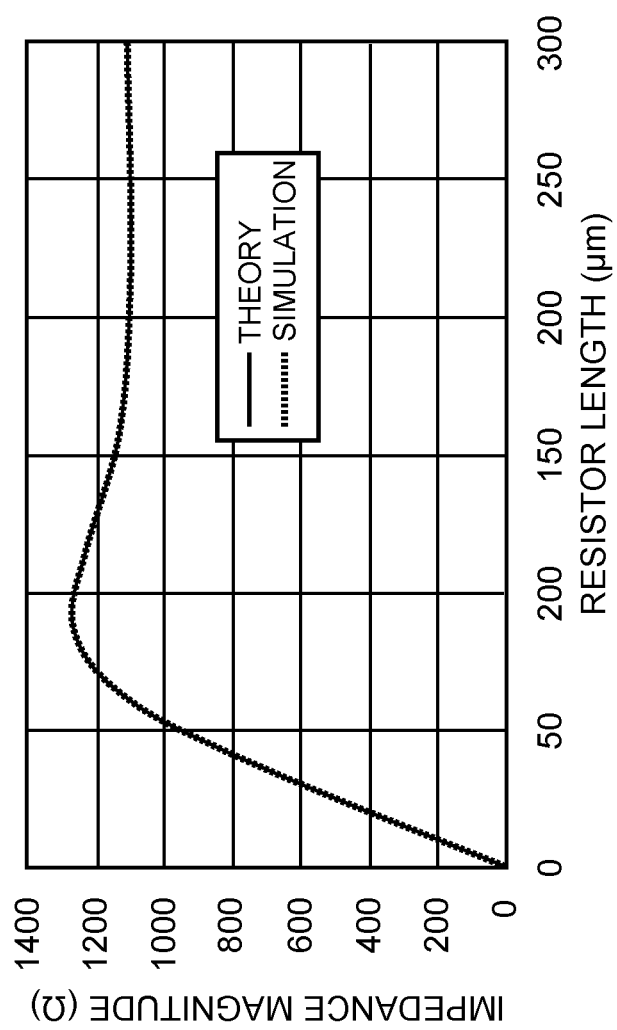
FIG. 1 is a diagram depicting a plot of magnitude input impedance function versus resistor length.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Monolithic solid-state switches are key components of many microwave systems. Solid-state switches using field-effect transistors (FETs) are controlled by applying a gate-to-source voltage (Vgs) corresponding to the desired state of the FET. Standard practice to date has been to apply Vgs through a resistor where the resistance is much larger than the impedance of the gate-to-source capacitance of the FET at the switch operating frequency. As operating frequency increases, the impedance of a thin-film resistor in a monolithic process is limited as shown within the disclosure. Furthermore, the current flowing in the thin-film resistor can present a reliability and robustness issue that cannot be overcome with industry standard design techniques. This disclosure presents a method by which switch reliability and robustness problems created by the gate resistor are eliminated. In addition, the presented method inherently allows an extremely fast switching speed relative to using a resistor as the gate termination.

To show the advantages of the embodiments herein, it is first important to understand the problem. As frequency increases, the achievable impedance of a thin-film resistor degrades. This presents an issue since a sufficient impedance is required (1) to block radio frequency (RF) current from leaking into the gate termination so low loss can be achieved and (2) to keep RF current low enough such that the resistor is robust and reliable. The first is the limiting case at low frequency, whereas the second is the limiting case at high frequency. The subsequent notes demonstrate the thin-film resistor impedance as a function of frequency and highlight the issue of robustness/reliability.

Recent high-frequency high-power RF switch designs have experienced failure of the gate bias resistors under RF drive. Circuit simulation reveals that the RF impedance of the bias resistors is considerably lower than expected based on the sheet resistance and dimensions of the resistor. It was also noted that making the resistor longer than a specific length did not significantly increase the impedance presented to the gate of the switch FET. This characteristic significantly limits the RF power capability of high-frequency switch designs that utilize gate resistors. To explain why this occurs, the resistor must be considered to behave like a lossy microstrip transmission line. To investigate further, consider the simplified case of the end of the resistor opposite to the one connected to the gate being short-circuited. Due to the RF loss of the resistor, the input impedance is not a strong function of load impedance. The impedance of a shorted transmission line is equal to $$Z_{in}(l) = Z_o \tanh(\gamma_R l),$$

where l is the length of the line. The propagation constant is given by the following:

$$\gamma_R = \sqrt{(R+j\omega L)(G+j\omega C)}.$$

Assuming a low loss silicon carbide (SiC) or gallium arsenide (GaAs) substrate, the conductance per unit length G is approximately zero and the propagation constant reduces to $$\gamma_R = \sqrt{j\omega C(R+j\omega)}.$$

The resistance per unit length, R, is related to the sheet resistance of the film and the width of the resistor as $R_s/w$. The inductance and capacitance per unit length can be estimated from the $Z_o$ and effective dielectric constant of a thin metal lossless microstrip line of the same width. For w/h<1 these parameters are $$\varepsilon_e = \frac{\varepsilon_r+1}{2} + \frac{\varepsilon_r-1}{2}\left[\sqrt{\frac{w}{w+12h}} + 0.04\left(1-\frac{w}{h}\right)^2\right]$$

and $$Z_o = \frac{60}{\sqrt{\varepsilon_e}}\ln\left(\frac{8h}{w} + \frac{w}{4h}\right).$$

Consider a w=6 μm wide microstrip line on a h=100 μm thick GaAs substrate at 30 GHz. Using a dielectric constant for GaAs of $\varepsilon_r$=12.9, $\varepsilon_e$=7.58 and $Z_o$=106.63 Ω from which inductance (L) and capacitance (C) are calculated:

$$C = \frac{\sqrt{\varepsilon_e}}{cZ_o}$$

and $$L = \frac{Z_o\sqrt{\varepsilon_e}}{c}.$$

The parameter c is the speed of light in a vacuum and is equal to $3.0\times10^8$ m/s. Evaluating L=0.979 μH/m and C=86.07 pF/m, and assuming a sheet resistance of $R_s$=120Ω/□, the resistance per unit length works out to be R=20 MΩ/m. Since R>>ωL and the propagation constant may be further approximated, then $$\gamma_R \approx \sqrt{j\omega RC} = (1+j)\sqrt{\frac{\omega RC}{2}} = (1+j)\gamma,$$

where γ is a real quantity defined as $$\gamma = \sqrt{\frac{\omega RC}{2}}.$$

This approximation is most accurate for very narrow resistors. Similarly the characteristic impedance is approximately equal to the following:

$$Z_o = \sqrt{\frac{R+j\omega L}{G+j\omega C}} \approx \sqrt{\frac{R}{j\omega C}} = (1-j)\sqrt{\frac{R}{2\omega C}}.$$

Note that $Z_o$ is now complex and frequency dependent. The magnitude squared of the resistor impedance is $$\frac{|Z_{in}(l)|^2}{|Z_o|^2} = \tanh[(1+j)\gamma l]\tanh[(1-j)\gamma l].$$

Using the definition, the hyperbolic tangent function is $$\frac{|Z_{in}(l)|^2}{|Z_o|^2} = \left(\frac{e^{2\gamma l}e^{j2\gamma l}-1}{e^{2\gamma l}e^{j2\gamma l}+1}\right)\left(\frac{e^{2\gamma l}e^{-j2\gamma l}-1}{e^{2\gamma l}e^{-j2\gamma l}+1}\right),$$

and expanding gives $$\frac{|Z_{in}(l)|^2}{|Z_o|^2} = \frac{e^{4\gamma l} - e^{2\gamma l}e^{j2\gamma l} - e^{2\gamma l}e^{-j2\gamma l} + 1}{e^{4\gamma l} + e^{2\gamma l}e^{j2\gamma l} + e^{2\gamma l}e^{-j2\gamma l} + 1},$$

and rearranging the magnitude impedance function for a thin-film resistor is equal to $$|Z_{in}(l)| = |Z_o|\sqrt{\frac{e^{4\gamma l} - 2e^{2\gamma l}\cos(2\gamma l) + 1}{e^{4\gamma l} + 2e^{2\gamma l}\cos(2\gamma l) + 1}}.$$

As expected this a purely real function. The asymptotic value $|Z_o|$ for very long resistors explains why the impedance of thin-film resistors no longer increases after a certain length. Using the parameters for the lossless 6 μm wide line, impedance works out to 1110Ω. Making the resistor longer will not increase the impedance past this value. By way of comparison, a 200 μm long 6 μm wide resistor has a direct current (DC) resistance of 4000Ω.

This is a serious problematic issue for high-power switches as half the RF voltage exists at the gate. For example, consider a shunt switch FET with a 10 W signal passing over it. The peak voltage in a 50Ω system is about 32 V on the RF line and 16 V at the gate node. A 6 μm wide resistor would then have 10.1 mA root mean square (RMS) current flowing into it. This is near damage level for both tantalum nitride (TaN) and epitaxial resistors of this width, and there is no way to reduce the current. Stacking FETs makes this problem worse. A four FET stack designed for equal voltage division puts 28.1 V on the gate of the top FET. The current entering that gate resistor of the top FET increases to nearly 18 mA RMS. A plot of the magnitude input impedance function versus resistor length for this example is shown in FIG. 1.

The results show that there is an optimum length that produces a maximum impedance level. This maximum is followed by a shallow minimum at a longer length before the expected asymptotic value is reached. The theoretical results are also in good agreement with those obtained with a commercial microwave circuit simulator.

An explicit equation for the optimum length and impedance may be derived by differentiating the square of the impedance function and setting that derivative equal to zero. After a lengthy manipulation, one can show that $$\frac{d}{dl}|Z_{in}|^2 \Rightarrow \tan(2\gamma l)(e^{4\gamma l}-1) + (e^{4\gamma l}+1) = 0,$$

which simplifies to the following transcendental equation. Fortunately, resistors for this application tend to be long enough where this expression is approximately equal to −1:

$$\tan(2\gamma l) = \frac{1+e^{4\gamma l}}{1-e^{4\gamma l}} \approx -1.$$

There are two primary solutions, the first representing the impedance maximum and the second representing the impedance minimum:

$$2\gamma l \approx \frac{3\pi}{4} \text{ or } \frac{7\pi}{4}.$$

The maximum impedance occurs at a length of $$l_{max} \approx \frac{3\pi}{8}\sqrt{\frac{2}{\omega RC}} = \frac{1.666}{\sqrt{\omega RC}},$$

followed by the minimum impedance at a length of $$l_{min} \approx \frac{7\pi}{8}\sqrt{\frac{2}{\omega RC}} = \frac{3.8875}{\sqrt{\omega RC}}.$$

Substituting optimum length back into the maximum impedance function, $$|Z_{in}|_{max} = |Z_o|\sqrt{\frac{e^{3\pi/2} + \sqrt{2}\, e^{3\pi/4} + 1}{e^{3\pi/2} - \sqrt{2}\, e^{3\pi/4} + 1}},$$

which reduces to the simple equation shown below. Using the optimum length produces a 14.3% increase in impedance over that of an arbitrarily long resistor. Note that the percentage increase is independent of frequency, resistor dimensions, or sheet resistance:

$$|Z_{in}|_{max} = 1.143|Z_0| = 1.143\sqrt{\frac{R}{\omega C}}.$$

As frequency decreases, the maximum impedance, asymptotic impedance, and optimum length all increase. This phenomena has significantly less impact for low-frequency switch designs. Evaluating these expressions for the 6 μm wide resistor example, $l_{max}$=92.5μm, $l_{min}$=215.8μm, and $|Z_{in}|_{max}$=1269Ω.

Figure 2:
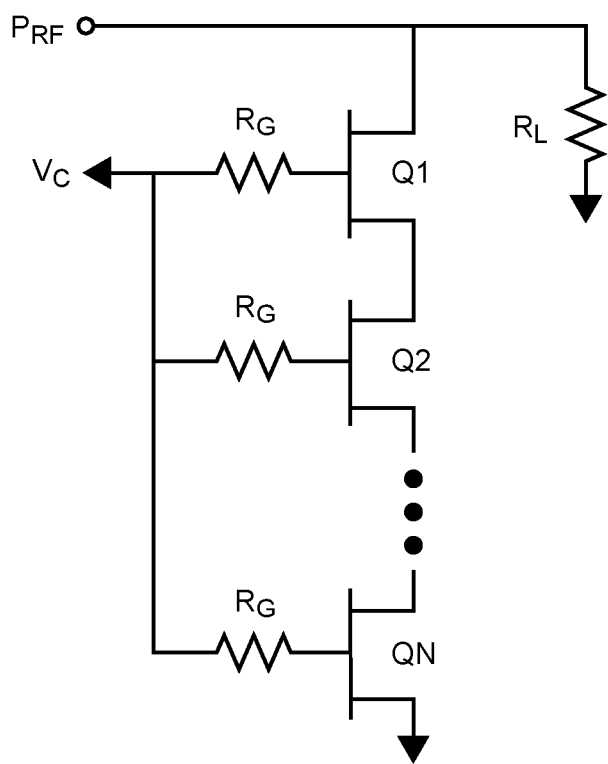
FIG. 2 is a schematic of a field-effect transistor (FET)-based shunt switch branch having stacked shunt FETs terminated in a load resistor.

These values are in very good agreement with the plot shown in FIG. 1. So what is the frequency range of a resistor-only gate bias circuit? Assume N stacked shunt FETs terminated in load $R_L$ as shown in FIG. 2.

If the gate bias resistor impedance is much higher than the input impedance of the switch FETs, the RF voltage splits evenly across the FET junctions. For incident power pulse repetition frequency ($P_{RE}$), the magnitude of the voltage on the gate of nth FET $Q_n$ is equal to $$|V_{G,Q_n}| = \left(\frac{2(N-n)+1}{2N}\right)\sqrt{2 P_{RF} R_L}.$$

The RMS current for the nth gate resistor is $$I_{RMS,n} = \frac{V_{G,Q_n}}{\sqrt{2}\,|Z_{in}(l)|} = \left(\frac{2(N-n)+1}{2N|Z_{in}(l)|}\right)\sqrt{P_{RF} R_L}.$$

Generally, the top FET has the highest gate voltage. Evaluating the RMS current for n=1 and assuming that optimum length gate resistors are used, the current for the top FET resistor is $$I_{RMS,Q_1} = \left(\frac{2N-1}{2.286N}\right)\sqrt{\frac{\omega C P_{RF} R_L w}{R_s}}.$$

The maximum safe thin-film resistor current level for the process is defined as δ(mA/μm). Setting the foregoing equal to the failure limit, $$I_{RMS,max} = w\delta = \left(\frac{2N-1}{2.286N}\right)\sqrt{\frac{\omega C P_{RF} R_L w}{R_s}},$$

and solving for frequency, $$f_{TFR} = 0.8317 \frac{N^2 w \delta^2 R_s}{(2N-1)^2 C P_{RF} R_L}.$$

Consider the 6 μm wide 120Ω/□ GaAs epitaxial (epi) resistor example and assume that this resistor can safely handle 1.5 mA/□m of RMS current. The power handling of the GaAs switch is specified to be 4 W into a 50Ω load, which would require N=4. Recall that C=86.07 pF/m, so the maximum safe operating frequency would then be equal to 25.56 GHz. Note that this frequency is proportional to the square of process current handling limit δ. It also decreases rapidly as additional FETs are stacked. The safe operating frequency for a two FET stack is 44% of that of a single FET. This reduction limits to 25% for an infinite number of FETs in the stack. Resistor power handling can also be considered as a function of frequency. Making frequency the independent variable and solving for RF power gives $$P_{RF} = 0.8317 \frac{N^2 w \delta^2 R_s}{(2N-1)^2 R_L C f}.$$

Figure 3:
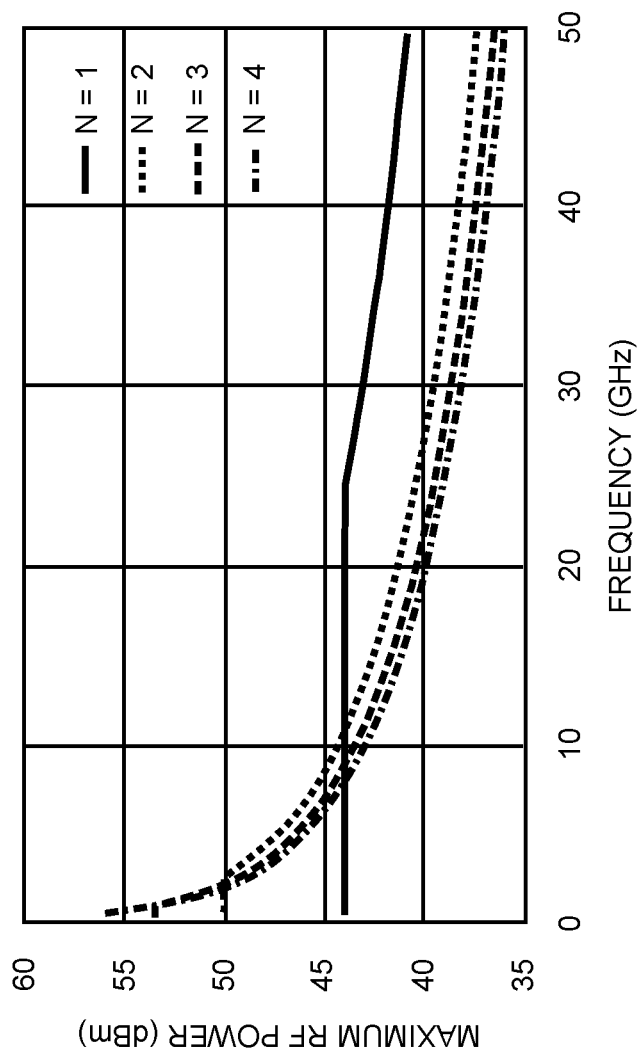
FIG. 3 is a diagram depicting a plot of maximum radio frequency (RF) power handling for the FET-based shunt switch branch of FIG. 2, wherein gate resistors are 6 μm wide gallium nitride resistors.

The maximum RF power handling for the n-type FET (N-FET) stack is plotted in FIG. 3. This analysis is for a 6 μm wide 400Ω/□ mesa resistor on 100 μm thick GaN15 epitaxial first gate resistor, GaN15 referring to a 0.15 μm gate length gallium nitride process. The resistor failure limit was assumed to be 1.0 mA/μm of RMS current, and data were generated for N=1 to N=4. The results may be interpreted as follows: where the trace is flat, the power is limited by control voltage. For the decreasing region at higher frequency, the power is limited by current in the gate bias resistor. For a single shunt FET, that is N=1, the RF power is limited by the 6 μm wide gate bias resistor above 24 GHz. For N>1 the gate bias resistor limits maximum power handling at all frequencies. At higher frequencies the stacking of FETs should be avoided if a thin-film resistor is used to bias the gate of the switch FETs.

Figure 4:
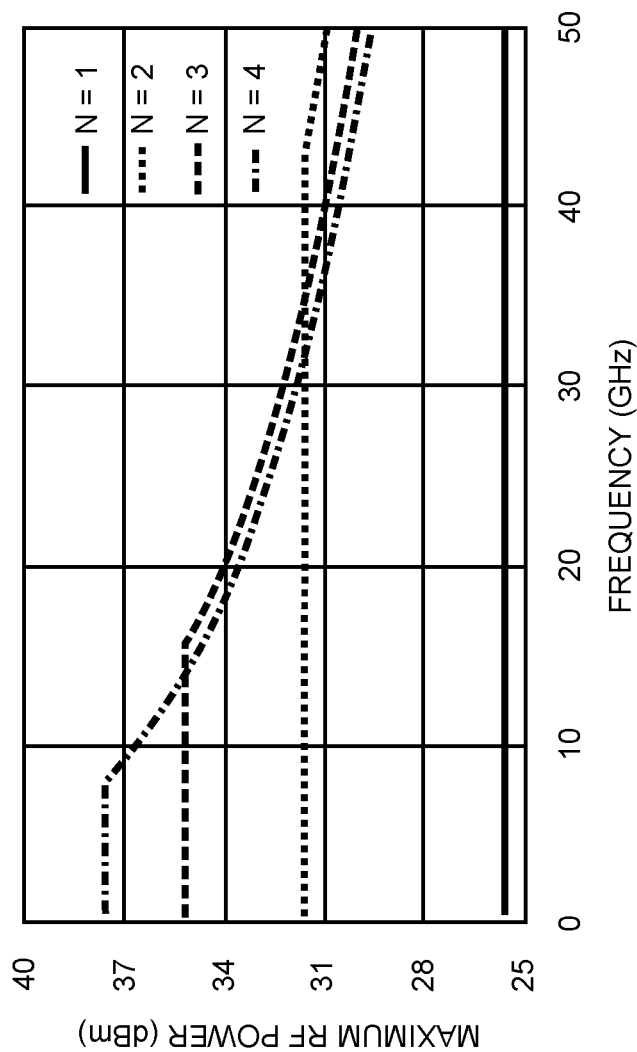
FIG. 4 is a diagram depicting a plot of maximum RF power handling for the FET-based shunt switch branch of FIG. 2, wherein gate resistors are 6 μm wide gallium arsenide resistors.

FIG. 4 is a diagram depicting a plot of maximum RF power handling for the FET-based shunt switch branch of FIG. 2, wherein gate resistors are 6 µm wide GaAs epi resistors. The situation looks very different for a 6 µm wide GaAs PHT09 epi gate resistor, PHT09 referring to a 0.09 µm gate length gallium arsenide process. The current in the gate bias resistor generally does not limit the RF power for N=1 and N=2 stacks. This changes dramatically for N=3 and N=4 topologies. At 30 GHz the best that can be done is about 32 dBm (N=3 stack) if the gate is biased with a 6 µm wide epi resistor.

Making the gate bias resistor wider increases power handling but also increases insertion loss. Wider resistors are lower impedance, and RF power dissipation for the resistor increases. The dissipated power for the nth optimum length gate resistor of the N-FET stack is given by $$P_{d,Q_n} = \frac{1}{2}\text{Re}(V_{G,Q_n} I^*_{G,Q_n}) = \frac{1}{2}\text{Re}\left(\frac{|V_{G,Q_n}|^2}{Z^*_{G,n}}\right).$$

For an arbitrary length resistor it can be shown that $$\text{Re}\left\{\frac{1/2}{Z^*_{in}(l)}\right\} = \sqrt{\frac{\omega C}{8R}}\left(\frac{e^{4\gamma l} + 2e^{2\gamma l}\sin(2\gamma l) + 1}{e^{4\gamma l} - 2e^{2\gamma l}\cos(2\gamma l) + 1}\right).$$

If optimum length gate bias resistors are used, $$2\gamma l \approx \frac{3\pi}{4},$$

and the portion in parenthesis is equal to unity:

$$\text{Re}\left\{\frac{1/2}{Z^*_{in}(l_{max})}\right\} = \sqrt{\frac{\omega C}{8R}}.$$

The power dissipation per gate bias resistor is $$P_{d,Q_n} = P_{RF} R_L \sqrt{\frac{\omega w_n C_n}{2R_s}}\left(\frac{2(N-n)+1}{2N}\right)^2.$$

The impact to insertion loss for the stack is found by subtracting the sum of the individual gate bias resistor power dissipations from the total incident power:

$$\Delta L(\text{dB}) = 10\text{Log}\left(1 - \frac{1}{P_{RF}}\sum_{n=1}^{N} P_{d,Q_n}\right).$$

Figure 5:
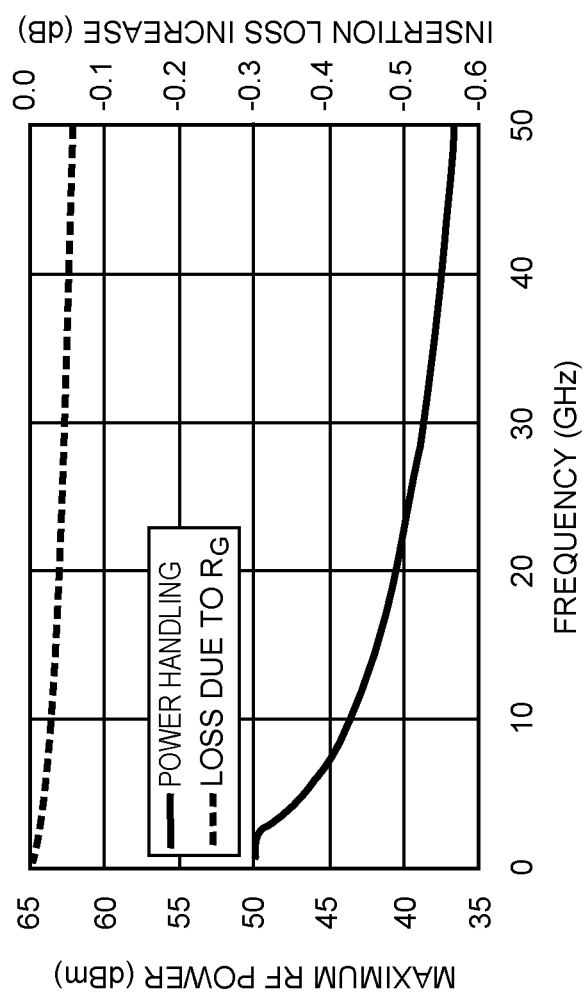
FIG. 5 is a diagram depicting a plot of maximum RF power handling and insertion loss for a 2-FET stack, wherein gate resistors are 6 μm wide gallium nitride (GaN15) epitaxial resistors, GaN15 referring to a 0.15 μm gate length gallium nitride process.
Figure 6:
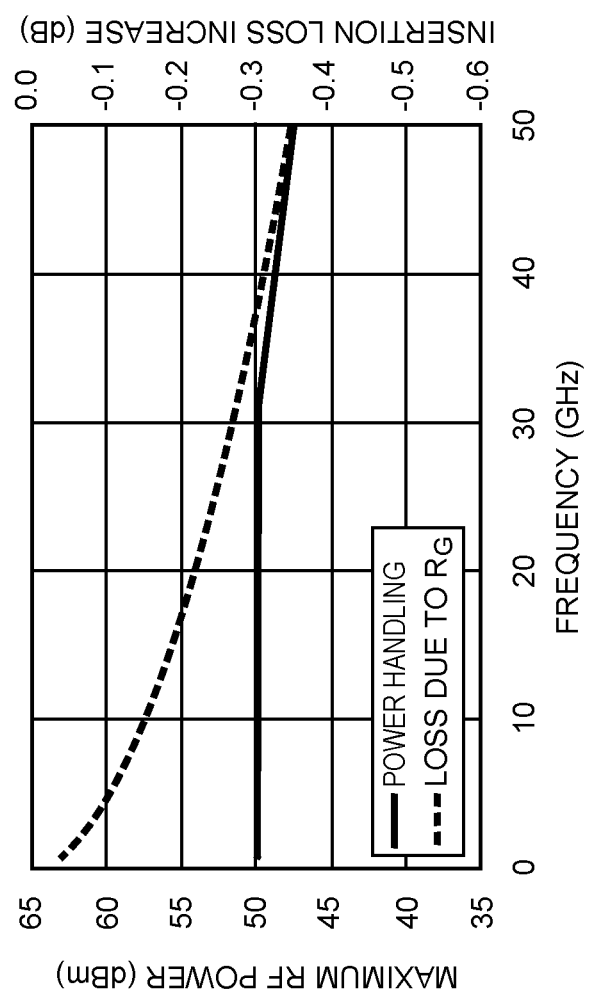
FIG. 6 is a diagram depicting a plot of maximum RF power handling and insertion loss for a 2-FET stack having an 80 μm wide GaN15 epitaxial first gate resistor coupled to a gate of a first transistor and a 9 μm wide GaN15 epitaxial second gate resistor coupled to a gate of a second transistor.
Figure 7:
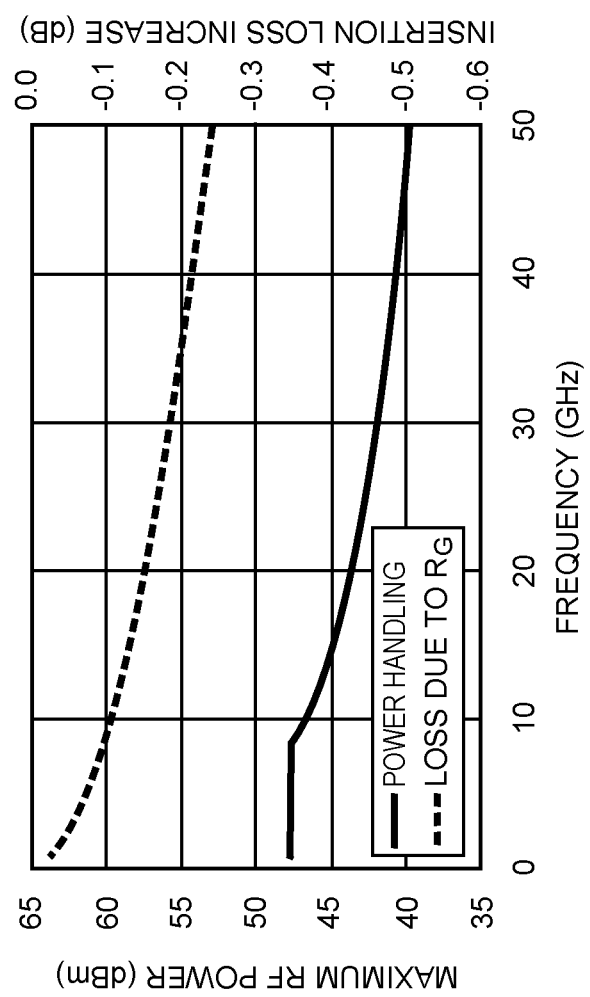
FIG. 7 is a diagram depicting a plot of maximum RF power handling and insertion loss for a 2-FET stack having 6 μm wide PHT09 epitaxial gate resistors coupled to a gate of a first transistor and a gate of a second transistor, respectively, PHT09 referring to a 0.09 μm gate length gallium arsenide process.

Note that this result is slightly pessimistic, as the finite impedance of the gate bias resistors causes the voltage splits across the FETs not to be perfectly symmetric as assumed. First consider a GaN15 epitaxial gate resistor example on a 2 mil substrate. The analysis results are plotted in FIG. 5 for a 2-FET stack. The gate bias mesa resistors are 6 µm wide and optimum length. At 30 GHz, power handling and additional loss are 38.8 dBm and −0.045 dB, respectively. Power handling is limited by the gate bias resistor current and is well under the theoretical 50 dBm level that one would expect given the −30 V control. Power handling can be traded for loss by making the gate bias resistors wider. The case shown in FIG. 6 is for an 80 µm wide Q1 gate resistor and an 9 µm wide Q2 gate resistor. The power handling capability at 30 GHz increases to the control voltage-limited value; however, the additional insertion loss due to the gate bias resistors has also increased to −0.267 dB. A similar situation occurs for GaAs PHT09 epitaxial gate resistor switch FETs. Analysis results are plotted in FIG. 7 for a 4-FET stack where all gate resistors are 6 µm wide. Power handling is gate resistor-limited above about 8 GHz. At 30 GHz, power handling and additional loss are estimated to be 31.7 dBm and 0.188 dB, respectively. This is nearly 6 dB below the control voltage-limited value of 37.6 dBm.

Figure 8:
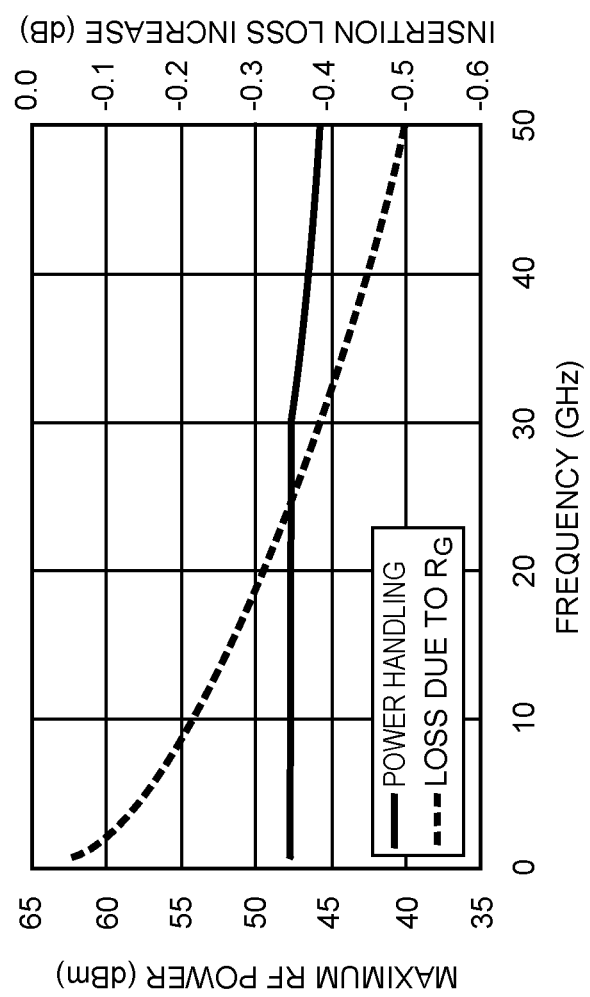
FIG. 8 is a diagram depicting a plot of maximum RF power handling and insertion loss for a 2-FET stack having a 24 μm wide PHT09 epitaxial first gate resistor coupled to a gate of a first transistor and a 13 μm wide PHT09 epitaxial second gate resistor coupled to a gate of a second transistor.

The power handling at 30 GHz can be recovered by increasing the Q1 and Q2 gate resistor widths to 24 µm and 13 µm, respectively. The width for Q3 and Q4 resistors remain 6 µm. Results for this scenario are plotted in FIG. 8. The power handling at 30 GHz is now control voltage-limited and the loss due to the gate resistors has increased to −0.386 dB.

Many microwave circuits require active devices to be used in a switching configuration. This means that a given active device is strictly operated in an off-state or an on-state. The off-state corresponds to the gate-to-source voltage remaining within a region where the active device remains in pinchoff. The DC gate-to-source voltage is typically set to halfway between the pinchoff voltage (Vp) and the breakdown voltage (Vbr) when the device is operated in the off-state. The on-state corresponds to the gate-to-source voltage remaining within a region where the active device is in full conduction (e.g., the current can reach Idss). The DC gate-to-source voltage is typically set to 0 V for depletion-mode devices such as GaN technology. The drain-to-source voltage is set to 0 V for a switching device. This is typically accomplished with either a large resistor or resonant inductor, depending on the application.

Microwave switches which control the path in which a signal flows are a vital component in many microwave systems. These may be single-pole, single-throw, or single-pole, multi-throw, or multi-pole, multi-throw switches. A single-pole, double-throw switch is a very common circuit used in microwave systems. These switches are often used for applications in which switching a common port between a transmit function and a receive function is desired. An example is an antenna to be switched between a power amplifier (transmit mode) and a low-noise amplifier (receive mode).

Figure 9:
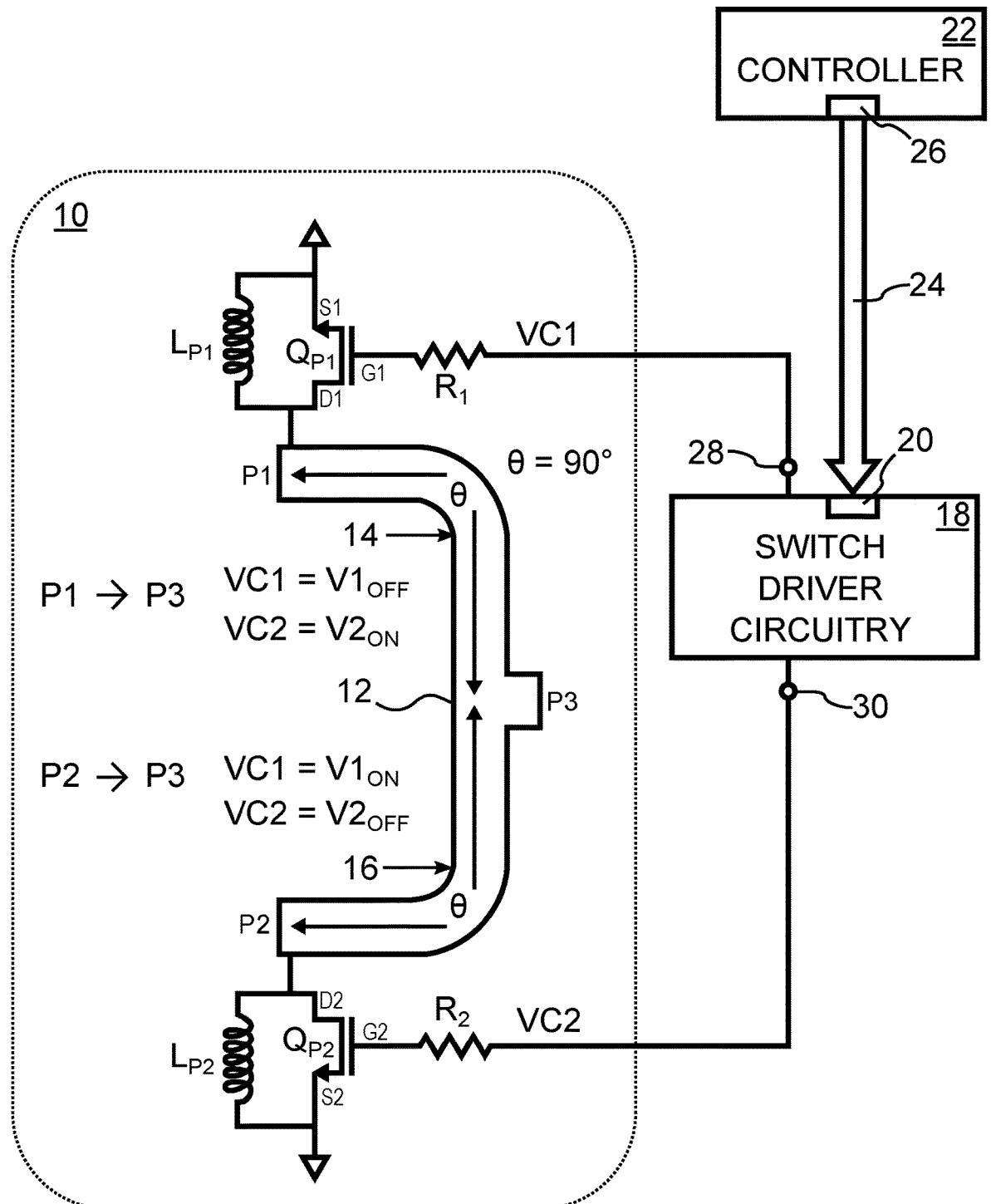
FIG. 9 is a structural diagram of related-art single-pole, double-throw (SPDT) switch circuitry that uses gate resistors.

FIG. 9 depicts a related-art implementation of RF switch circuitry 10 in the form of a single pole, double throw (SPDT) switch. In FIG. 9, a common port, in this case labeled as a third port P3, is switched between a first port P1 and a second port P2 using a first FET $Q_{P1}$ and a second FET $Q_{P2}$ that are operated as switches. A first source S1 of the first FET $Q_{P1}$ is coupled to a fixed voltage node, which in this exemplary case is ground. A first drain D1 of the first FET $Q_{P1}$ is coupled to the first port P1. A second source S2 of the second FET $Q_{P2}$ is coupled to the fixed voltage node, which in this exemplary case is ground. A second drain D2 of the second FET $Q_{P2}$ is coupled to the second port P2. The first port P1, the second port P2, and the third port P3 are electrically connected by a transmission line 12. The transmission line 12 has a top quarter-wave branch 14 and a bottom quarter-wave branch 16. When RF signals are allowed to pass between the third port P3 and the first port P1 by switch action, the top quarter-wave branch 14 provides a θ=90° phase shift to the RF signals. Moreover, when RF signals are allowed to pass between the third port P3 and the second port P2 by switch action, the bottom quarter-wave branch 16 provides a θ=90° phase shift to those RF signals.

The first FET $Q_{P1}$ and the second FET $Q_{P2}$ of the RF switch circuitry 10 are driven by a switch driver 18 that has a control input 20 for receiving switch-control signals from a controller 22. The controller 22 sends the switch-control signals over a control bus 24 that is coupled between a control output 26 of the controller 22 and the control input 20 of the switch driver 18. The controller 22 is configured to transmit a first switch-on signal that the switch driver 18 responds to by generating a first on-state voltage $V1_{ON}$ that drives the first FET $Q_{P1}$ into conduction, thereby allowing an RF signal to pass between the first drain D1 and the first source S1. In contrast, the controller 22 is also configured to transmit a first switch-off signal that the switch driver 18 responses to by generating a first off-state voltage $V1_{OFF}$ that drives the first FET $Q_{P1}$ into non-conduction that blocks the RF signal between the first drain D1 and the first source S1. The switch driver 18 includes a first driver terminal 28 for outputting the first on-state voltage $V1_{ON}$ and the first off-state voltage $V1_{OFF}$. A first gate resistor $R_1$ is coupled between a first gate G1 and the first driver terminal 28. The first gate resistor $R_1$ separates the first gate G1 from a first control voltage node VC1 that includes the first driver terminal 28. The first gate resistor $R_1$ typically has a resistance value range between 1000Ω to 100,000Ω.

The controller 22 is further configured to transmit a second switch-on signal that the switch driver 18 responds to by generating a second on-state voltage $V2_{ON}$ that drives the second FET $Q_{P2}$ into conduction, thereby allowing an RF signal to pass between the second drain D2 and the second source S2. In contrast, the controller 22 is also further configured to transmit a second switch-off signal that the switch driver 18 responds to by generating a second off-state voltage $V2_{OFF}$ that drives the second FET $Q_{P2}$ into non-conduction that blocks the RF signal from passing between the second drain D2 and the second source S2. The switch driver 18 further includes a second driver terminal 30 for outputting the second on-state voltage $V2_{ON}$ and the off-state voltage $V2_{OFF}$. A second gate resistor $R_2$ is coupled between a second gate G2 and the second driver terminal 30. The second gate resistor $R_2$ separates the second gate G2 from a second control voltage node VC2 that includes the second driver terminal 30. The second gate resistor $R_2$ typically has a resistance value range between 1000Ω to 100,000Ω.

To pass an RF signal between the first port P1 and the third port P3, voltage at the first control voltage node VC1 is set to the first off-state voltage $V1_{OFF}$ to place the first FET $Q_{P1}$ into the off-state while voltage at the second control voltage node VC2 is set to the second on-state $V2_{ON}$ to place the second FET $Q_{P2}$ into the on-state, which shorts the second port P2 to ground. The bottom quarter-wave branch 16 transforms the short at the second port P2 to an open at the third port P3, effectively isolating the second port P2 from both the first port P1 and the third port P3. Moreover, because the first FET $Q_{P1}$ is in the off-state, the first FET $Q_{P1}$ does not load the second port P2 and the RF signal is properly passed between the first port P1 and the third port P3. Toggling the voltages at the first control voltage node VC1 to the first on-state voltage $V1_{ON}$ and the second control voltage node VC2 to the second off-state voltage $V2_{OFF}$ allows RF signals to pass between the second port P2 and the third port P3. In this case, the bottom quarter-wave branch 14 transforms the short at the first port P1 to an open at the third port P3, effectively isolating the first port P1 from both the second port P2 and the third port P3.

A first parallel inductor $L_{P1}$ is coupled across the first FET $Q_{P1}$ between the first drain D1 and the first source S1. A second parallel inductor $L_{P2}$ is coupled across the second FET $Q_{P2}$ between second drain D2 and the second source S2. The first parallel inductor $L_{P1}$ and the second parallel inductor $L_{P2}$ equalize respective drain and source voltages while also resonating with the off-state device capacitance that is present when the first FET $Q_{P1}$ and the second FET $Q_{P2}$ are in the off-state. The first parallel inductor $L_{P1}$ and the second parallel inductor $L_{P2}$ may be replaced with resistors having resistance values that do not detrimentally load the first port P1 and the second port P2, or if the frequency of operation is low enough or of a broader bandwidth than can be achieved with an inductor.

There are many other examples of microwave circuits requiring devices operated as a switch. These include, but are not limited to, digital phase shifters, digital step attenuators, integrated front-end modules (e.g., a low-noise amplifier and power amplifier including a SPDT), and microwave circuits with re-configurable matching networks (e.g., tunable filters and power amplifiers). In all of these cases, the basic assumptions of the off-state and on-state usage of the device hold true as described above.

It is clear from the analysis and discussion provided above that usage of a resistor as the gate termination in a high-power switching application is problematic as frequency increases. Given the reliability issue discussed above, an alternative gate termination in accordance with the present disclosure is shown in FIG. 10.

Figure 10:
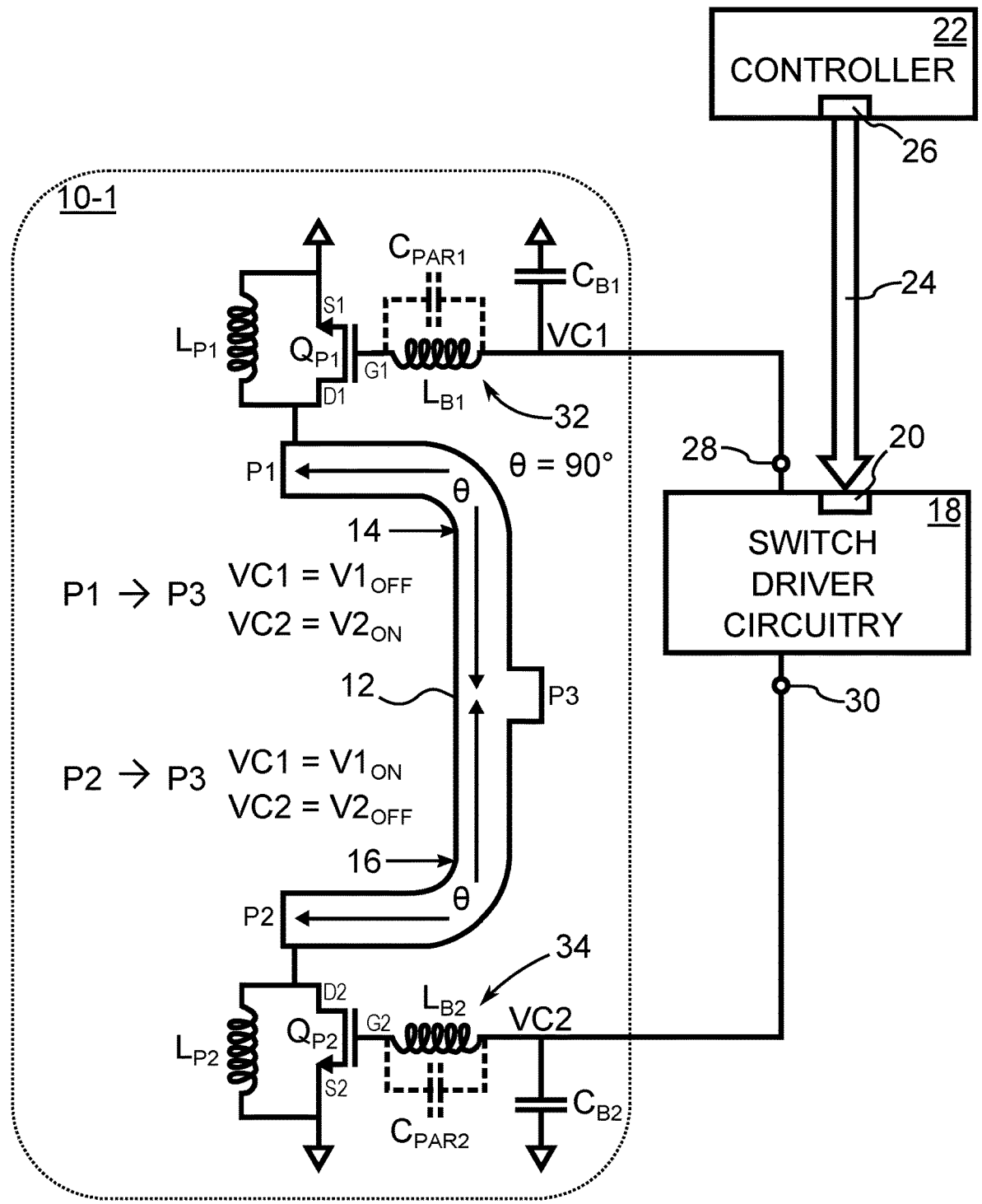
FIG. 10 is a structural diagram of a SPDT switch that incorporates exemplary resonator gate terminations that are in accordance with the present disclosure.

FIG. 10 is a structural diagram of a first exemplary embodiment of RF switch circuitry 10-1 that incorporates exemplary resonator gate terminations that are in accordance with the present disclosure. The RF switch circuitry 10-1 is also structured to provide a single pole, double throw (SPDT) switch function to switch RF signals between the first port P1 and the third port P3 and, alternatively, to switch RF signals between the second port P2 and the third port P3.

Comparing the RF switch circuitry 10-1 depicted in FIG. 10 with the related-art RF switch circuitry 10 depicted in FIG. 9, the first gate resistor R1 and the second gate resistor R2 have been replaced with a first low-pass filter 32 and a second low-pass filter 34, respectively. In the exemplary embodiment of FIG. 10, the first low-pass filter 32 includes a first inductor $L_{B1}$ that functions as a parallel resonator due to self-resonance caused by parasitic capacitance $C_{PAR1}$ of the first inductor $L_{B1}$. Furthermore, the second low-pass filter 34 includes a second inductor $L_{B2}$ that functions as a parallel resonator due to self-resonance caused by parasitic capacitance $C_{PAR2}$ of the second inductor $L_{B2}$. Due to self-resonance, the first inductor $L_{B1}$ and the second inductor $L_{B2}$ are each configured to provide high impedance within a desired operating bandwidth of the RF switch circuitry 10-1. FIG. 10 depicts a first bypass capacitor $C_{B1}$ coupled between the first voltage control node VC1 and ground, and a second bypass capacitor $C_{B2}$ coupled between the second voltage control node VC2 and ground. The first bypass capacitor $C_{B1}$ and the second bypass capacitor $C_{B2}$ have capacitance values sized to prevent undesirable oscillations that may possibly be initiated by external circuitry (not shown). However, it is to be understood that neither of the first bypass capacitor $C_{B1}$ nor the second bypass capacitor $C_{B2}$ is strictly necessary and each is therefore optional. In general, the first bypass capacitor $C_{B1}$ and the second bypass capacitor $C_{B2}$ each help control input impedance to the first low-pass filter 32 and the second low-pass filter 34, respectively, within an RF band of operation. Moreover, the first bypass capacitor $C_{B1}$ and the second bypass capacitor $C_{B2}$ each helps control input impedance independently of any off-chip terminating networks.

Figure 11:
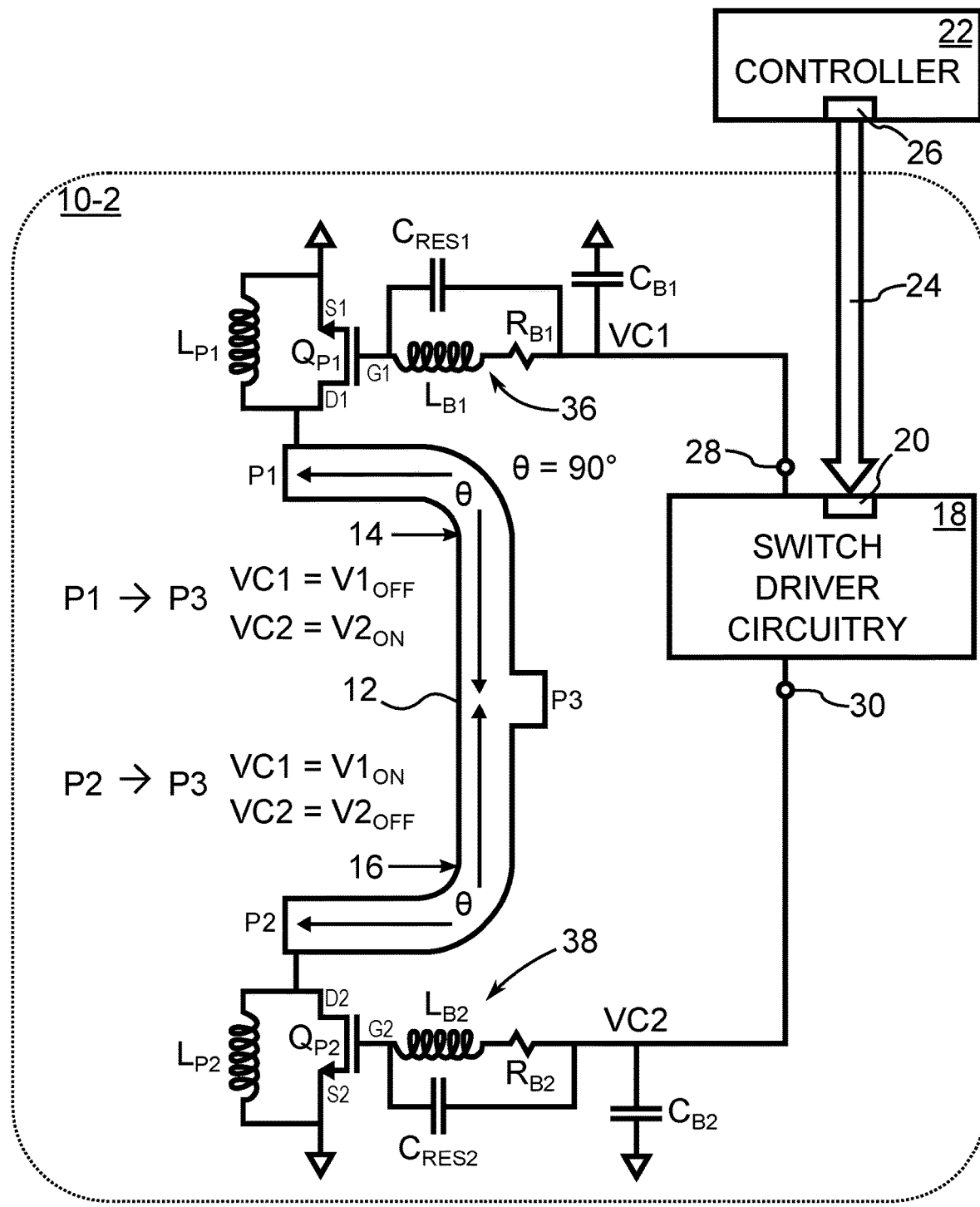
FIG. 11 is a structural diagram of another embodiment of SPDT RF switch circuitry that incorporates exemplary resonator gate terminations that are in accordance with the present disclosure.

FIG. 11 is a structural diagram of a second exemplary embodiment of RF switch circuitry 10-2 that incorporates exemplary resonator gate terminations that are in accordance with the present disclosure. The RF switch circuitry 10-2 is also structured to provide a SPDT switch function to switch RF signals between the first port P1 and the third port P3 and, alternatively, to switch RF signals between the second port P2 and the third port P3. In this second exemplary embodiment a modified first low-pass filter 36 and a modified second low-pass filter 38 include a first component-based capacitor $C_{RES1}$ and a second component-based capacitor $C_{RES2}$, respectively. A first resistance $R_{B1}$ of the first inductor $L_{B1}$ shown modeled in series with the first inductor $L_{B1}$ may be set during fabrication of the first inductor $L_{B1}$ to provide a desired quality Q of the first inductor $L_{B1}$. Similarly, a second resistance $R_{B2}$ of the second inductor $L_{B2}$ shown modeled in series with the second inductor $L_{B2}$ may be set during fabrication of the second inductor $L_{B2}$ to provide a desired quality Q of the second inductor $L_{B2}$. Higher resistance values for the first resistance $R_{B1}$ and the second resistance $R_{B2}$ decreases Q and increases operational bandwidth of the second exemplary embodiment of RF switch circuitry 10-2. Note that as shown in FIG. 10 some embodiments may integrate the switch driver circuitry 18 with RF switch circuitry as depicted integrated with the RF switch circuitry 10-2.

Figure 12:
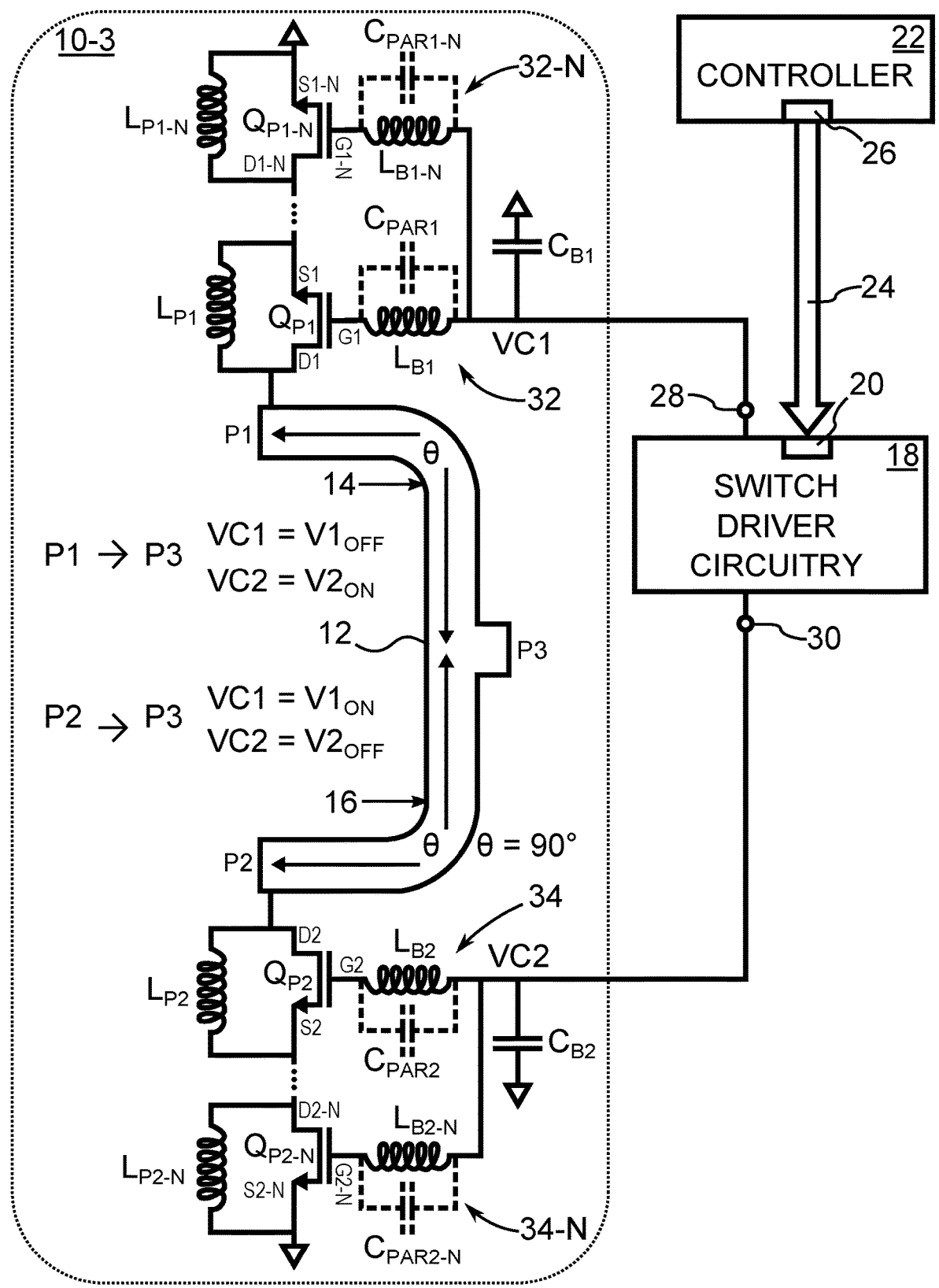
FIG. 12 is a structural diagram of yet another embodiment of SPDT RF switch circuitry that incorporates exemplary resonator gate terminations that are in accordance with the present disclosure.

FIG. 12 is a structural diagram of a third exemplary embodiment of RF switch circuitry 10-3 that incorporates exemplary resonator gate terminations that are in accordance with the present disclosure. The RF switch circuitry 10-3 is also structured to provide a SPDT switch function to switch RF signals between the first port P1 and the third port P3 and, alternatively, to switch RF signals between the second port P2 and the third port P3.

The RF switch circuitry 10-3 depicted in FIG. 12 includes a first plurality of additional FETs $Q_{P1-N}$ coupled in series from drain-to-source between the first source S1 of the first FET $Q_{P1}$ and ground. Each of the first plurality of additional FETs $Q_{P1-N}$ has an additional first low-pass filter 32-N coupled between first gates G1-N of the first plurality of additional FETs $Q_{P1-N}$ and the driver terminal 28. In the exemplary third embodiment of RF switch circuitry 10-3, each additional first low-pass filter 32-N has a first additional inductor $L_{B1-N}$ coupled between a respective first gate G1-N and the first driver terminal 28. Each first additional inductor $L_{B1-N}$ has a first parasitic capacitance $C_{PAR1-N}$.

The RF switch circuitry 10-3 further includes a second plurality of additional FETs $Q_{P2-N}$ coupled in series from drain-to-source between the second source S2 of the second FET $Q_{P2}$ and ground. Each of the second plurality of additional FETs $Q_{P2-N}$ has an additional second low-pass filter 34-N coupled between second additional gates G2-N of the plurality of second additional FETs $Q_{P2-N}$ and the second driver terminal 30. In the exemplary third embodiment of RF switch circuitry 10-3, each additional second low-pass filter 34-N has a second additional inductor $L_{B2-N}$ coupled between a respective second gate G2-N and the second driver terminal 30. Each second additional inductor $L_{B2-N}$ has a second parasitic capacitance $C_{PAR2-N}$.

One advantage that the RF switch circuitry 10-1, the RF circuitry 10-2, and the RF circuitry 10-3 depicted in FIGS. 10-12 have over the related-art RF switch circuitry 10 depicted in FIG. 9 is that the first gate resistor R1 and the second gate resistor R2 that have been shown to be unreliable at relatively high power and high frequency have been eliminated. For example, consider that equivalent current that normally destroys the first gate resistor R1 and the second gate resistor R2 flows through metal traces of the first inductor $L_{B1}$ and the second inductor $L_{B2}$ instead of encountering the resistance the first gate resistor R1 and the second gate resistor R2. The metal traces of the first inductor $L_{B1}$ and the second inductor $L_{B2}$ each have more than an order of magnitude higher RF current-handling capability compared with the first gate resistor R1 and the second gate resistor R2 of FIG. 9.

Figure 13:
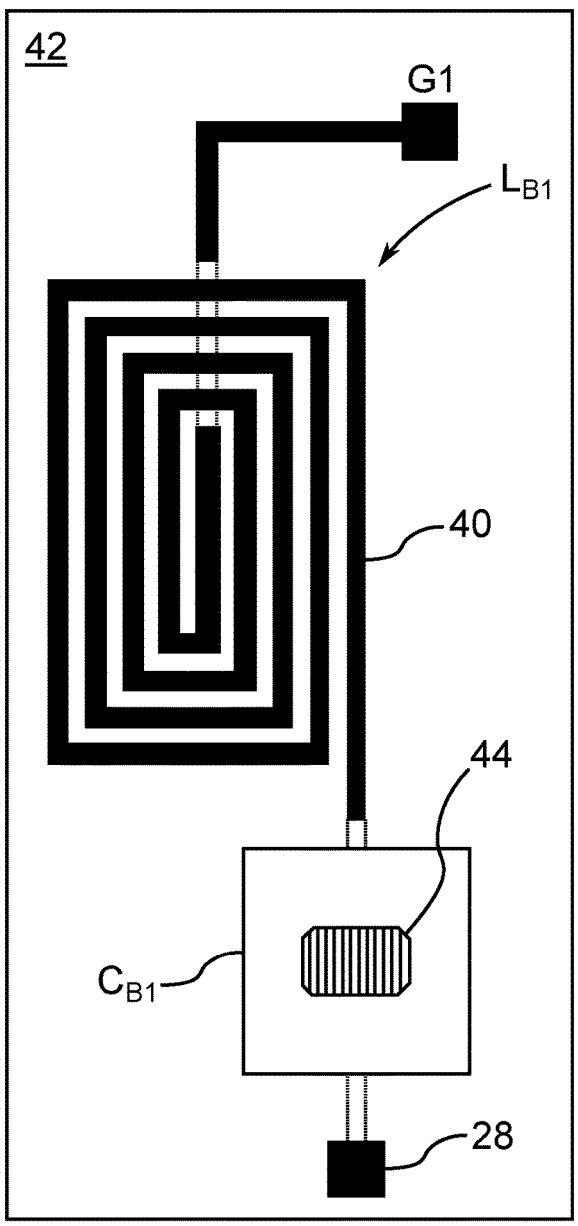
FIG. 13 is a structural diagram of a chip layout of the exemplary resonator gate termination embodiment depicted in FIG. 10.
Figure 14:
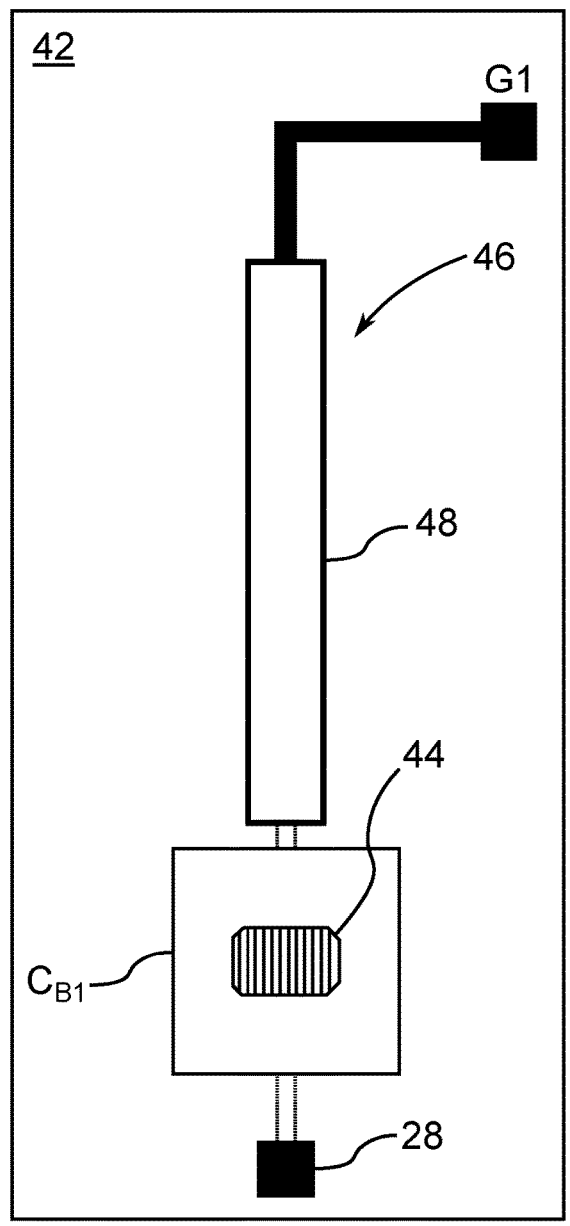
FIG. 14 is a structural diagram of a chip layout of a related-art gate resistive termination based upon a gate resistor having a resistance value of between a range of 1500Ω and 1,000,000Ω.

Another advantage that the RF switch circuitry 10-1, the RF circuitry 10-2, and the RF circuitry 10-3 depicted in FIGS. 10-12 have over the related-art RF switch circuitry 10 depicted in FIG. 9 is that 10% to 90% switching time speeds are at least five times faster for the RF switch circuitry 10-1, the RF circuitry 10-2, and the RF circuitry 10-3. As an example, FIG. 13 is a structural diagram of a chip layout of the exemplary resonator gate termination embodiment depicted in FIG. 10-1. FIG. 13 shows the first inductor $L_{B1}$ fabricated with a spiral metal trace 40 on a 2 mil silicon carbide substrate 42. An inductance of 1.426 nH is given for the inductance of the first inductor $L_{B1}$. A parasitic capacitance for the first inductor $L_{B1}$ is 0.0197 pF. The first inductor $L_{B1}$ is coupled between the driver terminal 28 and the first gate G1 of the first FET $Q_{P1}$ (not shown). The bypass capacitor $C_{B1}$ is coupled to ground by way of a ground via 44. A capacitance of 1 picofarad is given for the bypass capacitor $C_{B1}$ in this example, and a gate capacitance of 0.1 picofarad is assumed to be present at the first gate terminal G1. For comparison with the resonator gate termination of FIG. 13, FIG. 14 depicts a structural diagram of a chip layout of a related-art resistive gate termination 46 that has a passive resistor 48 that is fabricated over the 2 mil silicon carbide substrate 42. A resistance of 1000Ω is given as an example for the resistance of the passive resistor 48.

Figure 15:
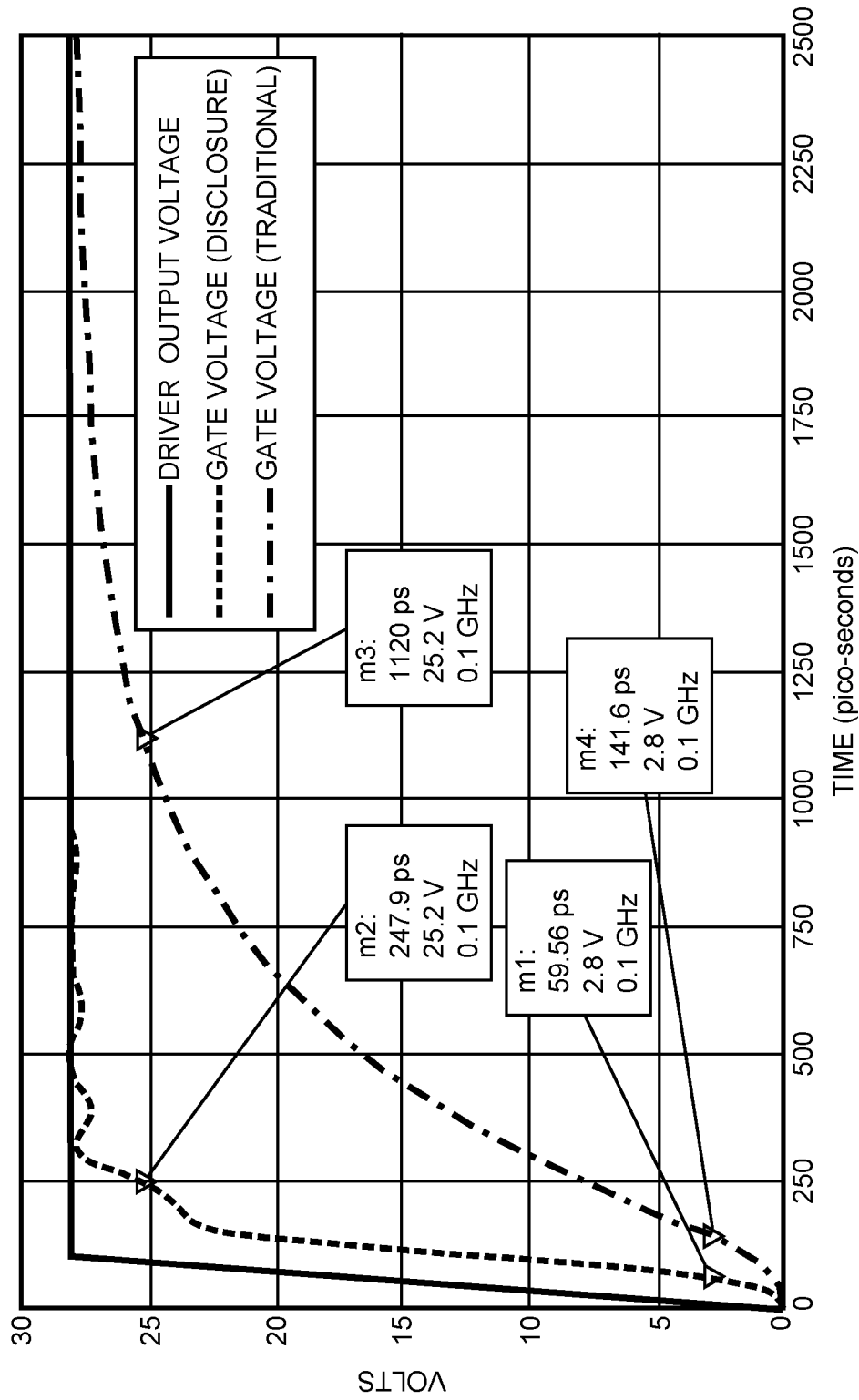
FIG. 15 is a graph of switching waveforms for an exemplary resonator gate termination of the structure of FIG. 13 and the resistive termination of the related-art structure of FIG. 14, respectively.

FIG. 15 is a graph of simulated switching waveforms for the exemplary resonator gate termination of the structure of FIG. 13 and the resistive termination of the related-art structure of FIG. 14, respectively. A total capacitance of 0.4 picofarad including the gate capacitance of 0.1 picofarad is a reasonable assumption that the first FET $Q_{P1}$ is a relatively large ka-band switch FET. A rise/fall time of 100 picoseconds for the driver output voltage is set in the simulation. A 10%-90% switch time for the exemplary resonator gate termination of the structure of FIG. 13 is 188.34 picoseconds versus 978.4 picoseconds for the related-art resistive gate termination 46 of FIG. 14.

Yet, another advantage that the RF switch circuitry 10-1, the RF circuitry 10-2, and the RF circuitry 10-3 depicted in FIGS. 10-12 have over the related-art RF switch circuitry 10 depicted in FIG. 9 is that impedance achievable at high frequency is significantly higher than that of the first resistor R1 and the second resistor R2. As an example, FIG. 13 shows a resonator created on 2 mil silicon carbide using the spiral metal trace 40 and the bypass capacitor $C_{B1}$. The self-capacitance of the first inductor $L_{B1}$ along with its inherent inductance creates a parallel resonance. The electromagnetic simulation of the structure in FIG. 13 with the second port P2 grounded is used to extract the magnitude of the impedance vs. frequency.

Figure 16:
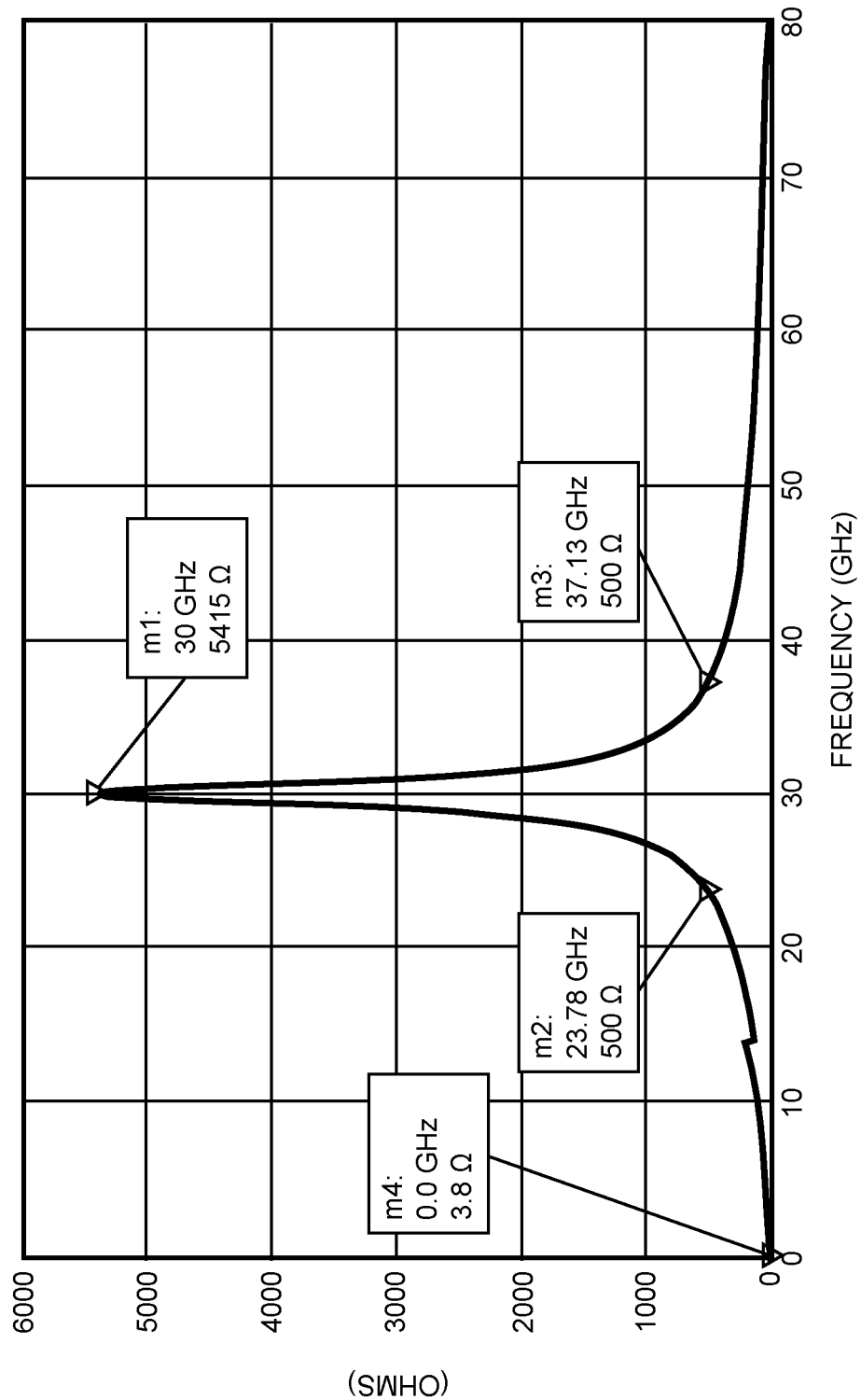
FIG. 16 is a diagram depicting a plot of impedance magnitude at the first port P1 of the structure depicted in FIG. 13.

FIG. 16 is a diagram depicting a plot of impedance magnitude at the first port P1 of the structure depicted in FIG. 13. Over 5 kΩ impedance is achieved at the resonant frequency of 30 GHz. In contrast, the thin-film resistor discussed previously achieves impedance of about 1.2 kΩ at the same frequency. Additionally, as shown in FIG. 16, over 500Ω of impedance is achieved from −24 GHz to 37 GHz. A switch FET having ~0.25 pF/mm of periphery that is 500 μm in size has a maximum Cgs impedance of 53Ω at 24 GHz, so having a 100× terminating gate impedance should be more than sufficient to enable a switch over that full bandwidth and surely higher in frequency than 37 GHz. The point is, even with a single resonant structure at high frequency, a broadband switch can be achieved.

The impedance at low frequency can be very low based on the network connecting to the bypass capacitor. FIG. 16 shows the impedance can be as low as 3.8Ω. In contrast, the resistive network has a substantially higher impedance at low frequency than it does at high frequency, making switching time orders of magnitude higher than what can be achieved with the parallel resonant circuit technique.

In addition to the structure proposed in FIG. 10, alternative structures in accordance with the present disclosure may be implemented that have similar features over a broader bandwidth. Effectively, the problem breaks down to a filter design problem where the constraint in the input impedance to the termination network must be sufficiently high relative to the gate-to-source capacitance of the device. This is certainly not problematic for high-power switches at frequencies S-band and above. The termination network may use multiple resonant structures to enforce this condition. In addition, if performance is desired at low frequency, an off-chip inductor can be used in the switch control line instead. Off-chip inductors of much higher values can be implemented off-chip compared with on-chip.

Those skilled in the art will recognize improvements and modifications to the preferred embodiments of the present disclosure. All such improvements and modifications are considered within the scope of the concepts disclosed herein and the claims that follow.

What is claimed is:
1. Radio frequency (RF) switch circuitry comprising:
a field-effect transistor (FET) having a drain, a source, and a gate;
a low-pass filter comprising an inductor coupled between the gate and a drive terminal of switch driver circuitry, wherein a direct current (DC) path between the gate and the drive terminal has a total DC resistance ranging between 0.1 Ω to 100 Ω; and
a plurality of additional FETs coupled in series drain-to-source between the source of first FET and a fixed voltage node, wherein each of the additional FETs has an additional low-pass filter coupled between gates of the additional FETs and the drive terminal.
2. The RF switch circuitry of claim 1 further comprising the switch driver circuitry, wherein the switch driver circuitry has a control input for receiving a switch-on signal and a switch-off signal and the drive terminal for outputting an on-state voltage and an off-state voltage, and is configured to respond to the switch-on signal by generating the on-state voltage that when applied to the gate allows an RF signal to pass between the drain and the source and to respond to the switch-off signal by generating the off-state voltage that when applied to the gate blocks the RF signal from passing between the drain and the source.
3. The RF switch circuitry of claim 1 wherein the inductor is configured for self-resonance at a predetermined frequency range from 10 GHz to 80 GHz.
4. The RF switch circuitry of claim 3 wherein at self-resonance an impedance magnitude of at least 5000Ω is generated in a series path between the drive terminal and the gate.
5. The RF switch circuitry of claim 3 wherein at self-resonance an impedance magnitude of at least 2500Ω is generated in a series path between the drive terminal and the gate.
6. The RF switch circuitry of claim 1 wherein a resonator capacitor is coupled in parallel with the inductor.
7. The RF switch circuitry of claim 6 wherein the resonator capacitor is a metal-insulator-metal type capacitor.
8. The RF switch circuitry of claim 1 wherein the total DC resistance in the DC path between the drive terminal and the gate ranges from 50Ω to 100Ω.
9. The RF switch circuitry of claim 1 wherein the total DC resistance in the DC path between the drive terminal and the gate ranges from 10Ω to 50Ω.
10. The RF switch circuitry of claim 1 wherein the total DC resistance in the DC path between the drive terminal and the gate ranges from 3Ω to 10Ω.
11. The RF switch circuitry of claim 1 wherein the total DC resistance in the DC path between the drive terminal and the gate ranges from 0.1Ω to 10Ω.
12. The RF switch circuitry of claim 1 wherein the inductor is coupled directly between the gate and the drive terminal.
13. The RF switch circuitry of claim 1 wherein the FET is a gallium nitride (GaN) FET.
14. The RF switch circuitry of claim 13 wherein the GaN FET is fabricated from GaN-on-silicon-on-insulator (GaN-SOI) technology.
15. The RF switch circuitry of claim 1 wherein switching speed between an off-state and an on-state of the FET ranges from 50 picoseconds to 500 picoseconds.
16. The RF switch circuitry of claim 1 wherein switching time between an off-state and an on-state of FET ranges from 500 picoseconds to 1 nanosecond.
17. The RF switch circuitry of claim 1 wherein a drain-to-source voltage is within 0.1% of zero volts when an RF signal of at least 10 W is present on the drain and the FET is not conducting in the off-state.
18. The RF switch circuitry of claim 1 wherein a drain-to-source voltage is within 0.1% of zero volts when an RF signal of at least 10 W is passing through the FET between the drain and source when the FET is in the on-state.
19. The RF switch circuitry of claim 1 wherein leakage current of the FET is no more than 100 picoamperes during operation.
20. The RF switch circuitry of claim 1 further comprising a Q-lowering resistor coupled between the drive terminal and the inductor, wherein the Q-lowering resistor has a DC resistance range from 0.5Ω to 10Ω.
21. The RF switch circuitry of claim 1 further including a bypass capacitor coupled between the control terminal and the fixed voltage node.
22. The RF switch circuitry of claim 21 wherein the fixed voltage node is ground.
23. The RF switch circuitry of claim 1 wherein the inductor is spiral metal trace formed over a substrate.

24. The RF switch circuitry of claim 23 wherein the substrate is silicon carbide.

25. The RF switch circuitry of claim 1 wherein each of the plurality of additional FETs is a GaN FET.

* * * * *

UNITED STATES PATENT AND TRADEMARK OFFICE
CERTIFICATE OF CORRECTION

PATENT NO. : 11,451,226 B2
APPLICATION NO. : 17/020993
DATED : September 20, 2022
INVENTOR(S) : Michael Roberg and Charles Forrest Campbell It is certified that error appears in the above-identified patent and that said Letters Patent is hereby corrected as shown below:

In the Specification

Column 4, Lines 60-61, replace "$\gamma_R = \sqrt{j\omega C(R + j\omega)}$." with --$\gamma_R = \sqrt{j\omega C(R + j\omega L)}$.--.

In the Claims
Claim 1, Column 15, Line 53, replace "between 0.1 Q to 100 Q" with --between 0.1 Ω to 100 Ω--.
Claim 16, Column 16, Line 44, replace "and an on-state of FET ranges" with --and an on-state of the FET ranges--.

Signed and Sealed this
Twenty-fifth Day of October, 2022

Katherine Kelly Vidal
*Director of the United States Patent and Trademark Office*